United States Patent
Van Bommel

(10) Patent No.: US 12,158,248 B2
(45) Date of Patent: Dec. 3, 2024

(54) LED FILAMENT ARRANGEMENT

(71) Applicant: SIGNIFY HOLDING B.V., Eindhoven (NL)

(72) Inventor: Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/572,314

(22) PCT Filed: Jun. 8, 2022

(86) PCT No.: PCT/EP2022/065478
§ 371 (c)(1),
(2) Date: Dec. 20, 2023

(87) PCT Pub. No.: WO2022/268500
PCT Pub. Date: Dec. 29, 2022

(65) Prior Publication Data
US 2024/0337356 A1    Oct. 10, 2024

(30) Foreign Application Priority Data
Jun. 25, 2021 (EP) ..................................... 21181785

(51) Int. Cl.
*F21S 4/28* (2016.01)
*F21K 9/232* (2016.01)
(Continued)

(52) U.S. Cl.
CPC ................ *F21K 9/68* (2016.08); *F21K 9/232* (2016.08); *F21Y 2103/10* (2016.08); *F21Y 2103/30* (2016.08); *F21Y 2107/50* (2016.08); *F21Y 2107/70* (2016.08); *F21Y 2113/17* (2016.08); *F21Y 2115/10* (2016.08)

(58) Field of Classification Search
CPC ........ F21K 9/68; F21K 9/232; F21Y 2103/10; F21Y 2103/30; F21Y 2107/50; F21Y 2107/70; F21Y 2113/17; F21Y 2115/10
See application file for complete search history.

(56) References Cited

U.S. PATENT DOCUMENTS

| | | |
|---|---|---|
| 2018/0066811 A1 | 3/2018 | Knapp et al. |
| 2019/0017657 A1 | 1/2019 | Kim et al. |
| 2020/0144230 A1 | 5/2020 | Lin et al. |

FOREIGN PATENT DOCUMENTS

| | | |
|---|---|---|
| CN | 208871526 U | 5/2019 |
| CN | 111578167 A | 8/2020 |

(Continued)

*Primary Examiner* — Elmito Breval

(57) ABSTRACT

A light emitting diode, LED, filament arrangement (100) arranged to emit LED filament arrangement light, comprising first and second LED filaments (110a, 110b) arranged to emit first and second LED filament light, respectively, wherein the first and second LED filaments elongate along a first axis, A, and comprise first and second arrays (120a, 120b) of a plurality of first and second LEDs (130a, 130b), a carrier (210) arranged to support the first and second LED filaments, at least one structure (160) arranged to at least partially redirect the first and second LED filament light, wherein the at least one structure is arranged adjacent at least one of the first and second LED filaments, and a controller (180) configured to individually control the operation of the first and second arrays of the plurality of first and second LEDs, respectively.

12 Claims, 7 Drawing Sheets

(51) Int. Cl.
*F21K 9/68* (2016.01)
*F21Y 103/10* (2016.01)
*F21Y 103/30* (2016.01)
*F21Y 107/50* (2016.01)
*F21Y 107/70* (2016.01)
*F21Y 113/17* (2016.01)
*F21Y 115/10* (2016.01)

(56) References Cited

FOREIGN PATENT DOCUMENTS

| | | |
|---|---|---|
| CN | 213333738 U | 6/2021 |
| WO | 2017085063 A1 | 5/2017 |
| WO | 2020173895 A1 | 9/2020 |
| WO | 2020190960 A1 | 9/2020 |

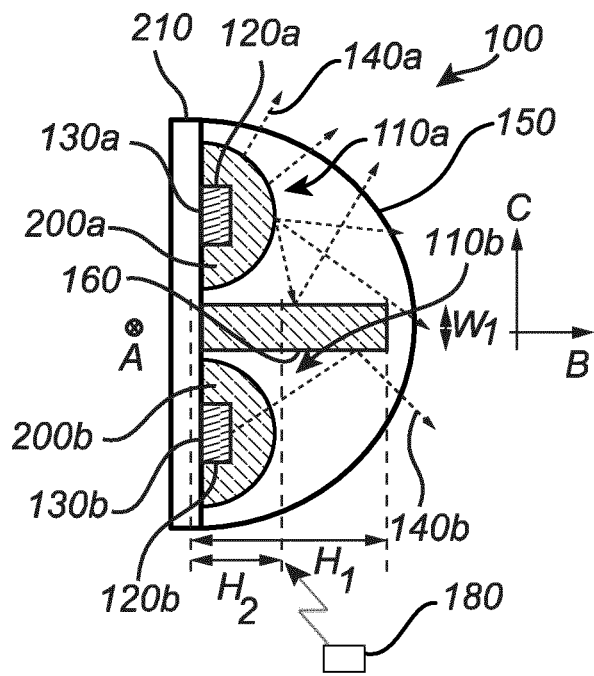
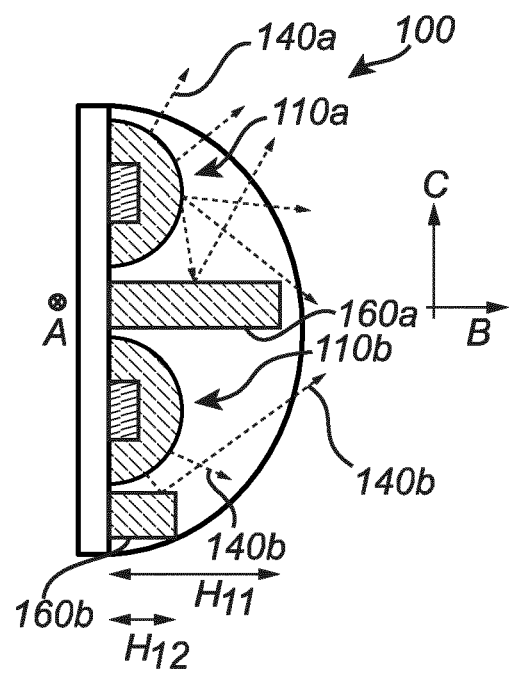
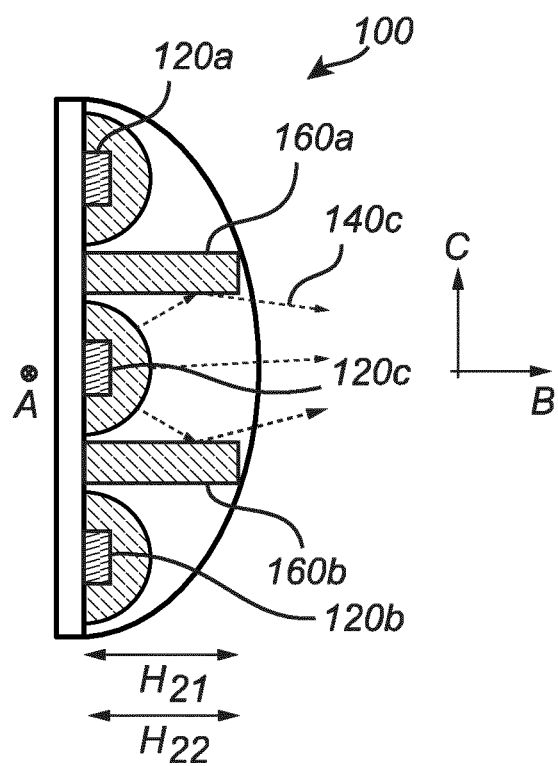
Fig. 2a
Fig. 2b
Fig. 2c

LED FILAMENT ARRANGEMENT

CROSS-REFERENCE TO PRIOR APPLICATIONS

This application is the U.S. National Phase application under 35 U.S.C. § 371 of International Application No. PCT/EP2022/065478, filed on Jun. 8, 2022, which claims the benefit of European Patent Application No. 21181785.3, filed on Jun. 25, 2021. These applications are hereby incorporated by reference herein.

FIELD OF THE INVENTION

The present invention generally relates to a light emitting diode, LED, filament arrangement.

BACKGROUND OF THE INVENTION

The use of light emitting diodes, LEDs, for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

Many LED filament lamps or devices in the prior art comprise LED filaments which are able to produce warm white light. However, it is of interest to improve the properties of the light emitted from the LED filaments, and in particular to improve the control of the direction of the light emitted from the LED filament lamps, without impairing the appearance and/or the decorative aspect of the LED filaments and/or the LED filament lamps.

Hence, it is an object of the present invention to increase the functionality of LED filament lamps by improving the properties of the light emitted from the LED filaments, in particular the spatial direction of the emitted light, whilst providing a desired aesthetical appearance and/or decorative aspect of the LED filaments and/or the LED filament lamps.

SUMMARY OF THE INVENTION

It is of interest to explore the possibility of combining one or more of the numerous advantages of LED filament arrangements comprising LEDs, whilst improving the properties of the light emitted from the LED filaments without impairing the appearance and/or the decorative aspect of the LED filaments and/or the LED filament lamps.

This and other objects are achieved by providing a LED filament arrangement having the features in the independent claim. Preferred embodiments are defined in the dependent claims.

Hence, according to the present invention, there is provided a LED filament arrangement arranged to emit LED filament arrangement light. The LED filament arrangement comprises at least a first LED filament arranged to emit first LED filament light. The at least a first LED filament elongates along a first axis, A, and comprises a first array of a plurality of first LEDs arranged to emit first LED light. The LED filament arrangement further comprises at least a second LED filament arranged to emit second LED filament light, wherein the at least a second LED filament elongates along the first axis, A, and comprises a second array of a plurality of second LEDs arranged to emit second LED light. The LED filament arrangement further comprises a carrier elongating along the first axis, A, wherein the carrier is arranged to support the at least a first LED filament and the at least a second LED filament. The LED filament arrangement comprises at least one structure arranged to at least partially redirect the first LED filament light and the second LED filament light, wherein the at least one structure elongates along the first axis, A, is arranged adjacent at least one of the at least a first LED filament and the at least a second LED filament, and extends along a second axis, B, parallel to a normal of the carrier. The LED filament arrangement further comprises a controller configured to individually control the operation of the first array of the plurality of first LEDs and the second array of the plurality of second LEDs.

Thus, the present invention is based on the idea of providing a LED filament arrangement wherein the one or more structures arranged in the LED filament arrangement may redirect (e.g. reflect and/or refract) the first and second LED filament light as controlled by the controller. The effect of the present invention is that the LED filament arrangement, via the controller, may provide an active light beam shaping of the emitted LED filament arrangement light. In other words, the LED filament arrangement may obtain a desired spatial and/or directional emission of the emitted LED filament arrangement light. For example, a top, side and/or bottom emission of the LED filament arrangement light may be achieved by the features of the LED filament arrangement. Consequently, the LED filament arrangement may provide a desired spatial emission of the LED filament arrangement light, whilst providing a desired aesthetical appearance and/or decorative aspect of the first and second LED filaments and/or the LED filament arrangement.

The present invention is further advantageous in that the LED filament arrangement may achieve a relatively slim line LED light emission, an improved mixing of the LED light and/or less spottiness of the LED light compared to prior art arrangements. The present invention is further advantageous in that the numerous advantages of using LED technology may be combined with the attractiveness and the appealing properties of the LED filament arrangement as disclosed.

The present invention is further advantageous in that the LED filament arrangement of the present invention comprises relatively few components. The low number of components is advantageous in that the LED filament arrangement is relatively inexpensive to fabricate. Moreover, the low number of components of the LED filament arrangement implies an easier recycling, especially compared to devices or arrangements comprising a relatively high number of components which impede an easy disassembling and/or recycling operation.

The LED filament arrangement according to the invention is arranged to emit LED filament arrangement light. The LED filament arrangement comprises at least a first LED filament arranged to emit first LED filament light. The at least a first LED filament elongates along a first axis, A, and comprises a first array of a plurality of first LEDs arranged to emit first LED light. By the term "array", it is here meant a linear arrangement or chain of LEDs, or the like. Analogously, the LED filament arrangement comprises at least a second LED filament arranged to emit second LED filament light, wherein the at least a second LED filament elongates along the first axis, A, and comprises a second array of a plurality of second LEDs arranged to emit second LED light. The LED filament arrangement further comprises a carrier elongating along the first axis, A, wherein the carrier is arranged to support the at least a first LED filament and the at least a second LED filament. Hence, the first and second LED filaments may furthermore be arranged, mounted and/or mechanically coupled on/to a carrier (e.g. a substrate), wherein the carrier is configured to support the LEDs. Furthermore, the carrier may be light transmissive and/or reflective.

The LED filament arrangement comprises at least one structure arranged to at least partially redirect the first LED filament light and the second LED filament light. By "structure", it is here meant substantially any element, component, or the like, which furthermore may have substantially any shape or form. In particular, in this context, one or more properties of the structure (i.e. the structure material) is (are) such that the structure is configured or arranged to redirect, e.g. reflect and/or refract, the first and second LED filament light. The at least one structure elongates along the first axis, A, is arranged adjacent at least one of the at least a first LED filament and the at least a second LED filament, and extends along a second axis, B, parallel to a normal of the carrier. Hence, the structure(s) is (are) arranged in a relatively close vicinity of the first and/or second LED filaments, and is (are) arranged such that at least a portion of the first and second LED filament light impinges on the structure(s) for redirection, reflection and/or refraction. The structure(s) is (are) hereby arranged to at least partially redirect the first LED filament light providing a first spatial light distribution and to at least partially redirect the second LED filament light providing a second spatial light distribution, which may be the same or different from said first spatial light distribution.

The LED filament arrangement further comprises a controller configured to individually control the operation of the first array of the plurality of first LEDs and the second array of the plurality of second LEDs. By the term "controller", it is here meant substantially any unit, device, arrangement, or the like, which is configured to control the operation (i.e. power, tuning, dimming, etc.) of the first and second array of the plurality of first and second LEDs, respectively.

According to an embodiment of the present invention, the at least one structure may be at least one of reflective and refractive, and wherein the at least one structure may be arranged to, at least one of, at least partially reflect at least one of the first LED filament light and the second LED filament light, and at least partially refract at least one of the first LED filament light and the second LED filament light. Hence, the structure(s) is (are) reflective and/or refractive, and the structure(s) is (are) arranged to at least partially reflect and/or refract the first and/or second LED filament light.

According to an embodiment of the present invention, the at least one structure may have a first height, $H_1$, along the second axis, B, and wherein at least one of the first array of the plurality of first LEDs and the second array of the plurality of second LEDs may have a second height, $H_2$, along the second axis, B, wherein $H_1 > 1.5 \cdot H_2$. Hence, the height, $H_1$, of the structure(s) may be higher, or even much higher, than the height, $H_2$, of the first and/or second arrays of the plurality of first and/or second LEDs, respectively. The present embodiment is advantageous in that the possibility of the structure(s) to redirect the first and second LED filament light is increased even further. The present embodiment is further advantageous in that the control of the spatial distribution of the LED filament arrangement light may be augmented even further.

According to an embodiment of the present invention, the at least one structure may have a first height, $H_1$, along the second axis, B, and wherein the at least one structure may have a first width, $W_1$, along a third axis, C, perpendicular to the first axis, A, and the second axis, B, wherein $H_1 > 1.5 \cdot W_1$. Hence, the dimension of the height, $H_1$, of the structure(s) may be larger, or even much larger, than the dimension of the width, $W_1$, of the structure(s).

According to an embodiment of the present invention, the carrier and the at least one structure may be unitary. Hence, the carrier and the structure(s) may be formed into a single unitary piece. The carrier may hereby have the properties of the structure(s), i.e. that the carrier may be arranged to at least partially redirect the first and second LED filament light, i.e. that the carrier may be reflective and/or refractive. The present embodiment is advantageous in that the unitary carrier and structure provides an efficient component for both supporting the first and second LED filaments as well as redirecting (reflecting and/or refracting) the first and second LED filament light. The present embodiment is advantageous in that the unitary carrier and structure effectively reduces the number of components of the LED filament arrangement, leading to an even more cost-efficient and/or more easily assembled arrangement.

According to an embodiment of the present invention, the at least one structure may be flexible. Hence, the structure(s) may comprise one or more materials such that the structure(s) may be bent and/or reformed in a relatively easy manner.

According to an embodiment of the present invention, the at least one structure may comprise at least one of silicone and polyurethane. Hence, the (flexible) structure(s) may comprise silicone and/or polyurethane.

According to an embodiment of the present invention, the at least one structure comprises reflective particles in a polymer matrix. By the term "reflective particles", it is here meant substantially any particles of a material which is configured to reflect light. By the term "polymer matrix", it is here meant a continuous phase arranged to hold the reflective particles. The present embodiment is advantageous in that the reflection of the first and second LED light by the structure(s) comprising the reflective particles may be improved even further.

According to an embodiment of the present invention, the at least one structure has a reflectivity of at least 80%. Hence, the structure(s) has (have) a relatively high degree of reflection. The present embodiment is advantageous in that the reflection of the first and second LED light provided by the structure(s) during operation of the LED filament arrangement may be improved even further.

According to an embodiment of the present invention, the LED filament arrangement may further comprise an encapsulant enclosing the at least a first LED filament and the at least a second LED filament, wherein the encapsulant comprises a light-transmissive material. By the term "encapsulant", it is here meant an elongated material, element, arrangement, or the like. In the present embodiment, the encapsulant is configured or arranged to at least partially surround, encapsulate and/or enclose the first and second LED filaments. By the term "light-transmissive material", it is here meant a material, composition and/or substance which is configured to transmit (i.e. transfer) light.

According to an embodiment of the present invention, at least one of the at least a first LED filament may comprise at least a first sub-encapsulant at least partially enclosing the first array of the plurality of first LEDs, wherein the at least a first sub-encapsulant comprises a first luminescent material for at least partly converting the first LED light into first converted LED light, and the at least a second LED filament may comprise at least a second sub-encapsulant at least partially enclosing the second array of the plurality of second LEDs, wherein the at least a second sub-encapsulant comprises a second luminescent material for at least partly converting the second LED light into second converted LED light. Hence, the first LED filament(s) and/or the second LED filaments may comprise a respective first and/or second sub-encapsulant of first and second luminescent material, respectively. It will be appreciated that the properties such as the material(s), shape(s), etc., of the first and second sub-encapsulant may be different or be the same.

According to an example of the present invention, at least one of the encapsulant, the first sub-encapsulant and the second sub-encapsulant of the LED filament comprises at least one of a luminescent material configured to at least partly convert the LED light emitted from the plurality of LEDs into converted light, and a light scattering material configured to scatter the LED light emitted from the plurality of LEDs. Hence, the encapsulant and/or the sub-encapsulants, which comprise(s) a light-transmissive material, further comprises a luminescent material configured to at least partly convert the LED light emitted from the plurality of first and/or second LEDs into converted light and/or a light scattering material configured to scatter the LED light emitted from the plurality of first and/or second LEDs.

According to an embodiment of the present invention, the at least a first LED filament may be arranged to emit first LED filament light with a first color temperature, $CT_1$, and the at least a second LED filament may be arranged to emit second LED filament light with a second color temperature, $CT_2$, wherein one of $CT_1=CT_2$ and $CT_1>CT_2$ is fulfilled. Hence, the first LED filament light emitted from the first LED filament(s) may have a first color temperature, $CT_1$, which may be the same as the second LED filament light emitted from the second LED filament(s) or higher than the second LED filament light emitted from the second LED filament(s). In case the first and second color temperatures are the same, i.e. $CT_1=CT_2$, this embodiment is advantageous in that a unitary color temperature may be achieved, which may be desired for various settings. For the embodiment in which $CT_1>CT_2$, the first color temperature, $CT_1$, may, for example, be relatively high, and the second color temperature, $CT_2$, may, for example, be relatively low. The present embodiment in which $CT_1>CT_2$ is fulfilled is advantageous in that the LED filament arrangement, via the difference in color temperature between its LED filaments, may provide a desired color temperature of the LED filament arrangement light. The present embodiment is further advantageous in that a difference in color temperature between the arrays of LEDs may even further contribute to the aesthetical attractiveness of the LED filament arrangement during operation. For example, the first and/or second plurality of LEDs in the first and/or second arrays may comprise so called RGB (red, green, blue) LEDs. The present example is advantageous in that the LED filament arrangement may achieve an effectful emission of the LED filament arrangement light and achieve a decorative LED filament arrangement during operation.

According to an embodiment of the present invention, the at least a first LED filament and the at least one second LED may elongate in, at least one of, a meandering shape in a plane, P, a spiral shape, and a helix shape. Hence, the first and second LED filaments may elongate in the meandering shape, the spiral shape and/or the helix shape according to the above. By "meandering shape", it is here meant an "S" shape, "snake" shape, or the like, wherein the first and second LED filaments elongate by this shape in a plane, P. By "spiral shape", it is here meant that the first and second LED filaments elongate in a coil or corkscrew shape. By "helix shape", it is here meant that the first and second LED filaments may be twisted around its own axis, i.e. around the axis, A. It should be noted that any combination of the above-mentioned examples may be feasible, such as a combination of the spiral shape and the helix shape. The present embodiment is advantageous in that the configuration(s) of the first and second LED filaments in the LED filament arrangement may achieve an effectful emission of the LED filament arrangement light and achieve a decorative LED filament arrangement during operation thereof.

According to an example of the present invention, at least one of the first LED filament and the second LED filament may elongate in a meandering shape in the plane, P, and wherein a shape of at least one of the first LED filament and the second LED filament the LED filament propagates along a third axis, C, and wherein a first angle, θ, between a tangent, $t_1$, of at least one of the first LED filament and the second LED filament in the plane, P, and the third axis, C, fulfills $|\theta|<85°$. In other words, the present example defines the inclination ("pitch") of the meandering shape. The present example is advantageous in that an even more advantageous light distribution may be obtained during operation of the LED filament arrangement. The present example is further advantageous in that the first and second LED filaments and/or the LED filament arrangement, may become even more aesthetically attractive.

According to an example of the present invention, at least one of the first LED filament and the second LED filament may elongate in, at least one of, a spiral shape, and a helix shape, wherein a shape of the LED filament propagates along a third axis, C, and wherein a first angle, θ, between a tangent, $t_1$, of the LED filament in a plane, $P_1$, spanned by the third axis, C, and the tangent, $t_1$, fulfills $60°<\theta<85°$. In other words, the present example defines the inclination ("pitch") of the spiral and/or helix shape of the first and/or second LED filaments. The present example is advantageous in that an even more advantageous light distribution may be obtained during operation of the LED filament arrangement. The present example is further advantageous in that the first and second LED filaments and/or the LED filament arrangement, may appear even more aesthetically attractive to an observer.

According to an example of the present invention the LED filament may elongate in, at least one of, a spiral shape, and a helix shape, wherein a shape of the LED filament propagates along a third axis, C, and wherein a radius, R, between the LED filament and the third axis, C, decreases along the third axis, C, such that the LED filament has a cone shape, wherein the cone angle, a, of the cone shape of the LED filament fulfills $0°<\alpha<30°$. In other words, the present example defines the cone-shape (or "Christmas tree" shape) of the spiral and/or helix shape of the first and/or second LED filaments. The present example is advantageous in that the cone-shape of the first and second LED filaments of the LED filament arrangement may appear even more aesthetically attractive to an observer. The present example is further advantageous in that an even more advantageous light distribution may be obtained during operation of the LED filament arrangement.

According to an embodiment of the present invention, the controller may be configured to individually control the operation of the first array of the plurality of first LEDs and the second array of the plurality of second LEDs by at least one of increasing a first intensity, $I_1$, of the first array of the plurality of first LEDs, and one of maintaining a second intensity, $I_2$, and decreasing a second intensity, $I_2$, of the second array of the plurality of second LEDs, and decreasing a first intensity, $I_1$, of the first array of the plurality of first LEDs, and one of maintaining a second intensity, $I_2$, and increasing a second intensity, $I_2$, of the second array of the plurality of second LEDs. Hence, the controller may be configured to individually control the operation of the first and second arrays of the plurality of first and second LEDs, respectively, by increasing the first intensity, $I_1$, of the first array of the plurality of first LEDs, and either maintaining or decreasing the second intensity, $I_2$, of the second array of the plurality of second LEDs, and/or decreasing the first intensity, $I_1$, of the first array of the plurality of first LEDs, and either maintaining or increasing the second intensity, $I_2$, of the second array of the plurality of second LEDs. It will be appreciated that in case the controller is configured to increase and decrease the first intensity, $I_1$, of the first array of the plurality of first LEDs and/or increase and decrease the second intensity, $I_2$, of the second array of the plurality of second LEDs, the increase and decrease is performed by the controller at different instances in time.

According to an embodiment of the present invention, there is provided a lighting device. The lighting device may comprise a LED filament arrangement according to any one of the preceding embodiments, and a cover comprising an at least partially light-transmissive material, wherein the cover at least partially encloses the LED filament arrangement. The lighting device may further comprise an electrical connection connected to the LED filament arrangement for a supply of power to the plurality of LEDs of the LED filament arrangement.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

FIGS. 2a-c show LED filament arrangements according to exemplifying embodiment of the present invention.

DETAILED DESCRIPTION

Figure 1:
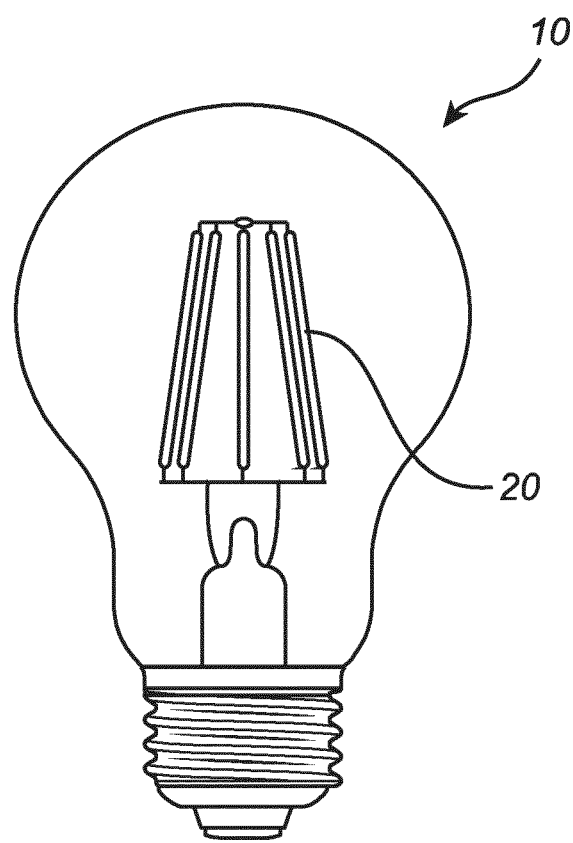
FIG. 1 shows a LED filament lamp according to the prior art.

FIG. 1 shows a LED filament lamp 10 according to the prior art, comprising a plurality of LED filaments 20. LED filament lamps 10 of this kind are highly appreciated as they are very decorative, as well as providing numerous advantages compared to incandescent lamps such as a longer operational life, a reduced power consumption, and an increased efficiency related to the ratio between light energy and heat energy. LED filament lamps 10 of this kind are able to produce warm white light. However, it is of interest to improve the properties of the light emitted from the LED filaments 20, and in particular to improve the control of the direction of the light emitted from the LED filaments 20, without impairing the appearance and/or the decorative aspect of the LED filaments 20 and/or the LED filament lamps 10.

FIG. 2 shows a LED filament arrangement 100 according to an exemplifying embodiment of the present invention. The LED filament arrangement 100 is arranged to emit LED filament arrangement light. The LED filament arrangement 100 comprises a first and a second LED filament 110a, 110b which elongate along an axis, A, respectively, and FIG. 2 hereby shows the LED filament arrangement 100 in a cross-section, perpendicular to the axis, A. The first and second LED filaments 110a, 110b comprise a first array 120a of a plurality of first LEDs 130a arranged to emit first LED light 140a and a second array 120b of a plurality of second LEDs 130b arranged to emit second LED light 140b, respectively. However, it should be noted that the first and/or second LED filaments 110a, 110b may comprise substantially any number of first and/or second array(s) 120a, 120b such as a (single) first and/or second array 120a, 120b of LEDs, a plurality of first and/or second arrays of LEDs, etc. The plurality of first and second LEDs 130a, 130b, respectively, preferably comprises more than 5 LEDs, more preferably more than 8 LEDs, and even more preferred more than 10 LEDs. The plurality of first and/or second LEDs 130a, 130b may be direct emitting LEDs which provide a color. Preferably, the first and second LED filaments 110a, 110b have a length, L, (not shown) and a width, W, (not shown) wherein L>5W.

In the example of the LED filament arrangement 100 in FIG. 2a, the LED filament 110 comprises a (single) first array 120a of a first plurality of LEDs 130a, and analogously, a (single) second array 120b of a second plurality of LEDs 130b. Hence, the LED filament arrangement 100 comprises two columns of LEDs 130a, 130b. The first and second plurality of LEDs 130a, 130b may be of the same type or may differ from each other by one or more properties. For example, the first array 120a of the first plurality of LEDs 130a may be configured to emit light with a first color temperature, $CT_1$ (not shown) and the second array 120b of the plurality of second LEDs 130b may be configured to emit light with a second color temperature, $CT_2$ (not shown). For example, $CT_1 > CT_2$, wherein preferably, $CT_1 - CT_2 > 300$ K, more preferred $CT_1 - CT_2 > 700$ K, and even more preferred $CT_1 - CT_2 > 900$ K. According to another, alternative example, the color temperature may be the same, i.e. $CT_1 = CT_2$. According to another example, the first array 120a of the plurality of first LEDs 130a may be configured to emit light with a first color temperature, $CT_1$, and the second array 120b of the plurality of second LEDs 130b may comprise a plurality of red, green, blue (and white) LEDs, i.e. RGB(W) LEDs.

In FIG. 2a, the LED filament arrangement 100 comprises a carrier 210 arranged to support the first and second arrays 120a, 120b of the plurality of first and second LEDs 130a, 130b. Preferably, the first and second LEDs 130a, 130b are arranged on an elongated carrier 210 like for instance a substrate that may be flexible (e.g. comprising silicone and/or polyurethane). The carrier 210 may be monolithic and may have electrical tracks. In case the carrier 210 comprises a first major surface and an opposite second major surface, the first and second arrays 120a, 120b of the plurality of first and second LEDs 130a, 130b may be arranged on at least one of these surfaces.

The LED filament arrangement 100 in FIG. 2a further comprises a structure 160 which is arranged to at least partially redirect the first LED filament light and the second LED filament light. The structure 160 elongates along the first axis, A. The structure 160 is arranged adjacent the first LED filament 110a and the second LED filament 110b. More specifically, the structure 160 is arranged between the first LED filament 110a and the second LED filament 110b. The structure 160 extends along a second axis, B, parallel to a normal of the carrier 210. The structure 160 is arranged in a relatively close vicinity of the first and second LED filaments 110a, 110b, and is arranged such that at least a portion of the first and second LED filament light impinges on the structure 160 for redirection, reflection and/or refraction, as indicated by the dashed lines in FIG. 2a. The structure 160 may have one or more properties, e.g. comprise one or more specific materials, such that the structure 160 is configured or arranged to redirect, e.g. reflect and/or refract, the first and second LED filament light. The structure 160 may be flexible, i.e. the structure 160 comprise a material which is easily bent, folded, or the like. The material of the structure 160 may, for example, be silicone and/or polyurethane. Furthermore, the structure 160 may comprise reflective particles in a polymer matrix. According to yet another example, the reflectivity of the structure 160 may be at least 80%.

The structure 160 of the LED filament arrangement 100 in FIG. 2a has a first height, $H_1$, along the second axis, B, wherein the first and second arrays 120a, 120b of the plurality of first and second LEDs 130a, 130b have a second height, $H_2$ (here including first and second sub-encapsulants 200a, 200b, respectively) along the second axis, B, wherein $H_1 > 1.5 \cdot H_2$. According to the example in FIG. 2a, the height, $H_1$, of the structure 160 is much higher than the height, $H_2$, of the first and second arrays 120a, 120b of the plurality of first and second LEDs 130a, 130b. Furthermore, the structure 160 has a first width, $W_1$, along a third axis, C, perpendicular to the first axis, A, and the second axis, B, wherein $H_1 > 1.5 \cdot W_1$. Hence, the dimension of the height, $H_1$, of the structure 160 is larger, or even much larger, than the dimension of the width, $W_1$, of the structure 160.

The LED filament arrangement 100 further comprises an encapsulant 150. The encapsulant 150, which has an elongated shape along the first axis, A, and comprises a light-transmissive material, encloses the first LED filament 110a and the second LED filament 110b. The encapsulant 150 may be a polymer material which may be flexible such as for example a silicone.

The LED filament arrangement 100 further comprises a first sub-encapsulant 200a at least partially enclosing the first array 120a of the plurality of first LEDs 130a of the first LED filament 110a. The first sub-encapsulant 200a comprises a first luminescent material for at least partly converting the first LED light 140a into first converted LED light. Analogously, the second LED filament 110b comprises a second sub-encapsulant 200b at least partially enclosing the second array 120b of the plurality of second LEDs 130b. The second sub-encapsulant 200b comprises a second luminescent material for at least partly converting the second LED light 140b into second converted LED light.

The first and/or second luminescent material of the first and second sub-encapsulants 200a, 200b, may be a light-scattering material, e.g. a polymer matrix comprising $BaSO_4$, $Al_2O_3$ and/or $TiO_2$ particles. The luminescent material may be a phosphor such as an inorganic phosphor (e.g. YAG, LuAG, ECAS, KSiF, etc.) and/or quantum dots or rods. The phosphor may further be e.g. a (blue) green/yellow and/or red phosphor. The luminescent material may hereby be configured to convert e.g. UV LED light into blue converted light and/or UV/blue LED into green/yellow and/or red converted light. Although not shown in FIG. 2a, a thickness of the encapsulant 150 and/or a concentration of the luminescent material in the encapsulant 150 may vary over the length of the LED filament 110 along the axis, A. The first and/or second sub-encapsulants 200a, 200b may differ from the material of the encapsulant 150. It should be noted that the first and second sub-encapsulants 200a, 200b may have the same properties (material, dimension, etc.) or may differ in one or more properties.

The LED filament arrangement 100 further comprises a (schematically indicated) controller 180 which is configured to individually control the operation of the first array 120a of the plurality of first LEDs 130a and the second array 120b of the plurality of second LEDs 130b. The controller 180 may be connected to the plurality of first and second LEDs 130a, 130b by wire or by a wireless connection. The controller 180 is configured to control the (an) operation of the LED filament arrangement 100 such as power, tuning, dimming, etc. of the first and second arrays 120a, 120b of the plurality of first and second LEDs 130a, 130b, respectively.

FIG. 2b shows an alternative example of the LED filament arrangement 100 as disclosed in FIG. 2a. It will be appreciated that the features and/or functioning of the LED filament arrangement 100 in FIG. 2b is similar to that described in FIG. 2a, and it is hereby referred to that figure and text for an increased understanding. In FIG. 2b, the LED filament arrangement 100 comprises two structures 160a, 160b. The first structure 160a is arranged between the first LED filament 110a and the second LED filament 110b. The second structure 160b is arranged adjacent the second LED filament 110b at a periphery of the LED filament arrangement 100. The first structure 160a of the LED filament arrangement 100 has a first height, $H_{11}$ (here including the first sub-encapsulant) along the second axis, B, wherein the second structure 160b of the LED filament arrangement 100 has a first height, $H_{12}$ (here including the second sub-encapsulant) along the second axis, B. According to this example, $H_{11} \approx 2 \cdot H_{12}$, but it should be noted that other height relationships between the first and second structures 160a, 160b are feasible.

Due to the difference of the arrangement of the structure(s) 160 and/or one or more properties of the structure(s) 160 of the LED filament arrangements 100 as exemplified FIG. 2a, and FIG. 2b, different emissions of LED filament arrangement light may be obtained as schematically indicated by the first LED light 140a and the second LED light 140b. Furthermore, the respective controller 180 of the LED filament arrangement 100 may control the LED filament arrangement light according to different purposes and/or desired settings.

FIG. 2c shows yet another alternative example of the LED filament arrangement 100 as disclosed in FIG. 2a and FIG. 2b. It will be appreciated that the features and/or functioning of the LED filament arrangement 100 in FIG. 2c is similar to that described in FIG. 2a, and it is hereby referred to that figure and text for an increased understanding. In FIG. 2c, the LED filament arrangement 100 comprises three arrays of LEDs 120a-c and two structures 160a, 160b, wherein each structure 160a, 160b is arranged adjacent and between two arrays of LEDs. The first structure 160a of the LED filament arrangement 100 has a first height, $H_{21}$, along the second axis, B, wherein the second structure 160b of the LED filament arrangement 100 has a first height, $H_{22}$, along the second axis, B. According to this example, $H_{21} = H_{22}$, but it should be noted that other height relationships between the first and second structures 160a, 160b are feasible.

By the different number of arrays of LEDs and/or number of structure(s) 160 and/or properties of the structure(s) 160 (e.g. height, reflectivity, etc.) of the LED filament arrangements as exemplified in FIGS. 2a-c, different emissions of LED filament arrangement light may be obtained according to different purposes and/or desired settings. For example, the third array 120c may be arranged to emit third LED light 140c which is redirected (reflected) by the first and/or second structures 160a, 160b.

Figure 3A:
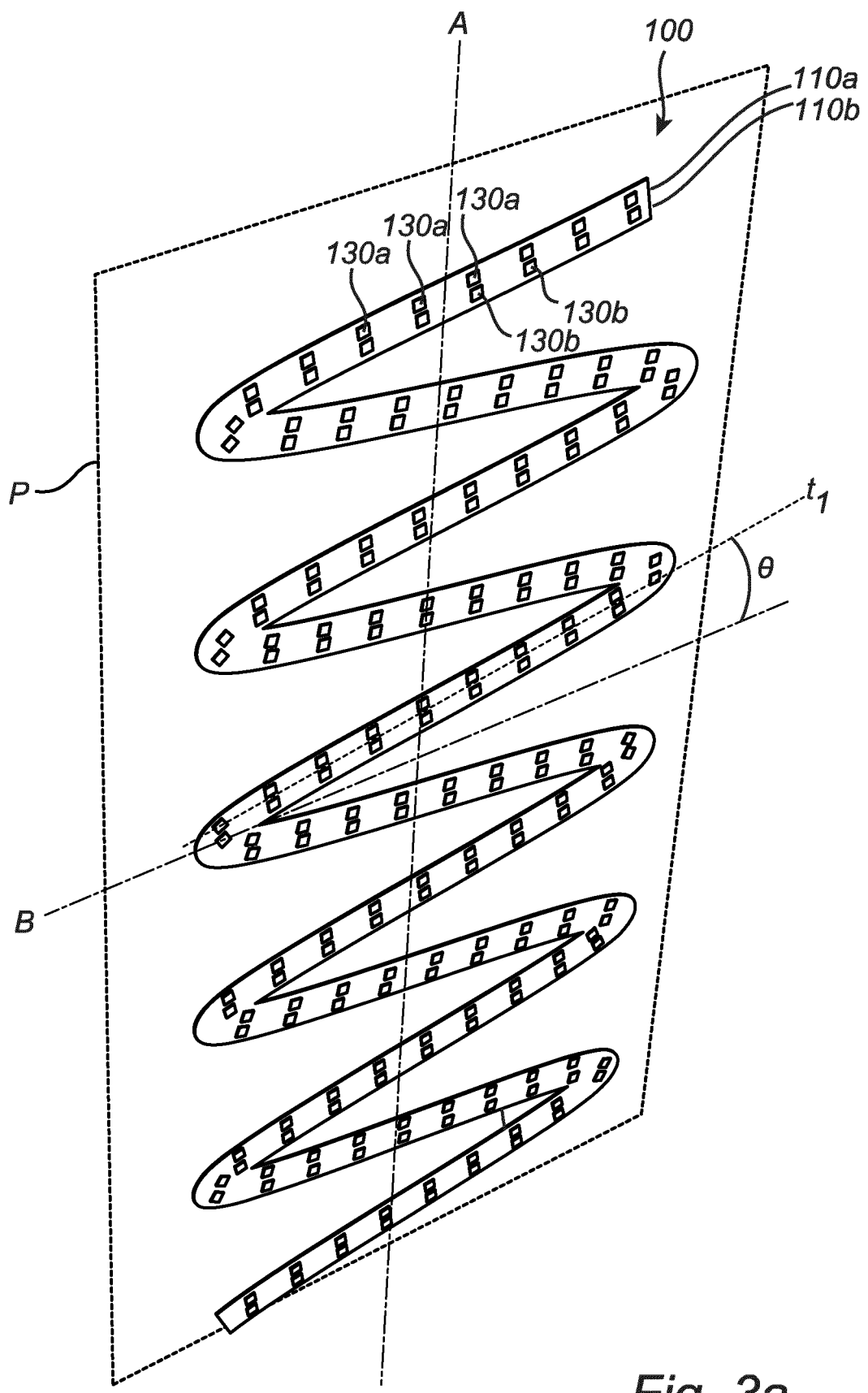
FIGS. 3a-3c show LED filaments of a LED filament arrangement according to exemplifying embodiments of the present invention.
Figure 3B:
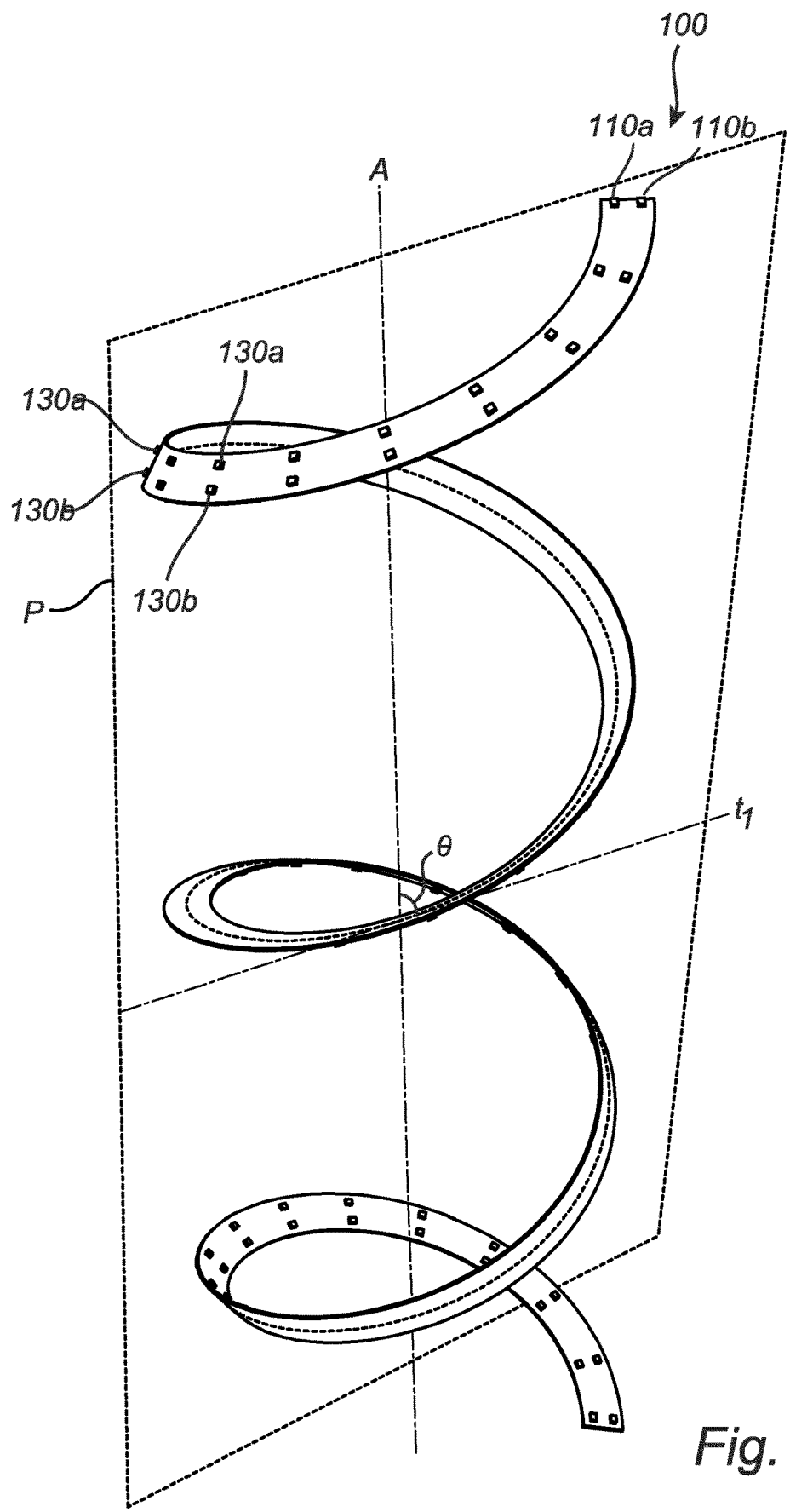
Figure 3C:
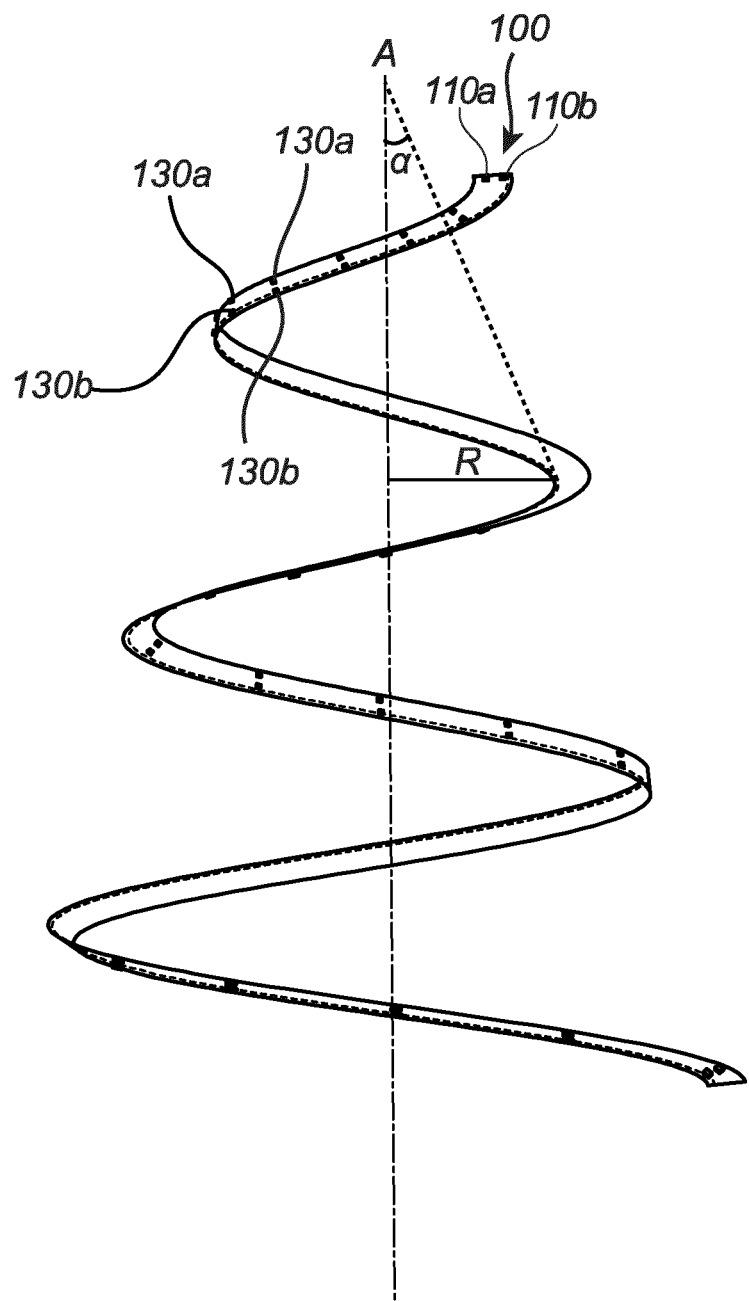

FIGS. 3a-3c show LED filaments 110 of a LED filament arrangement 100 according to exemplifying embodiments of the present invention. More specifically, FIGS. 3a-3c show different geometric examples or configurations of the LED filaments 110 in FIG. 2a-c, and it is referred to FIGS. 2a-c and the associated text for an increased understanding of the components and/or functions of the LED filament 110 and/or LED filament arrangement 100. For an improved overview, some elements/components of the LED filament arrangement 100 in FIGS. 2a-c have been removed in FIGS. 3a-c.

In FIG. 3a, the first and second LED filaments 110a, 110b, respectively comprising a plurality of first and second LEDs 130a, 130b, of the LED filament arrangement 100, elongate in a meandering shape in a plane, P, spanned by the first axis, A, and second axis, B. Hence, according to this example, the LED filament 110 elongates in an "S" shape, "snake" shape, or the like, in the plane, P. The shape of the first and second LED filaments 110a, 110b propagates along the first axis, A. A first angle, θ, between a tangent, $t_1$, of the first and/or second LED filaments 110a, 110b in the plane, P, and the first axis, A, fulfills |θ|<85°. In other words, the example of the LED filament arrangement 100 in FIG. 3a defines the inclination ("pitch") of its meandering shape.

In FIG. 3b, the first and second LED filaments 110a, 110b, respectively comprising a plurality of first and second LEDs 130a, 130b, of the LED filament arrangement 100 elongate in a spiral or helix shape. The shape of the first and second LED filaments 110a, 110b propagates along a first axis, A. A first angle, θ, between a tangent, $t_1$, of the first and/or second LED filaments 110a, 110b in a plane, $P_1$, spanned by the first axis, A, and the tangent, $t_1$, fulfills 60°<θ<85°. The present example hereby defines the inclination ("pitch") of the spiral and/or helix shape of the first and/or second LED filaments 110a, 110b.

In FIG. 3c, the first and second LED filaments 110a, 110b, respectively comprising a plurality of first and second LEDs 130a, 130b, of the LED filament arrangement 100 elongate in a spiral or helix shape. The shape of the first and second LED filaments 110a, 110b propagates along a first axis, A. A radius, R, between the first and/or second LED filaments 110a, 110b and the first axis, A, decreases along the first axis, A, such that the first and second LED filaments 110a, 110b have a cone shape. The cone angle, α, of the cone shape of the LED filament fulfills 0°<α<30°, and the first and second LED filaments 110a, 110b hereby take on a cone-shape or "Christmas tree" shape.

Figure 4:
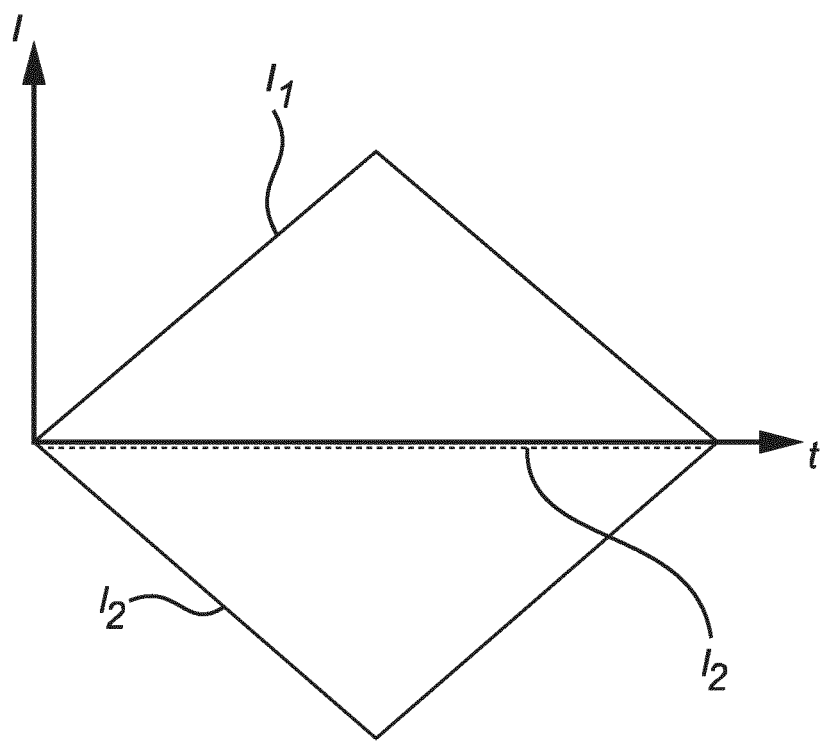
FIG. 4 shows an operation of a LED filament arrangement according to exemplifying embodiments of the present invention.

FIG. 4 shows an operation of a LED filament arrangement 100 according to an exemplifying embodiment of the present invention, showing the intensity, I, as a function of time, t, of the LED filament arrangement light. The controller of the LED filament arrangement according to any one of the previously described embodiments is configured to individually control the operation of the first and second arrays of the plurality of first and second LEDs of the first and second LED filaments by increasing a first intensity, $I_1$, of the first array of the plurality of first LEDs of the first LED filament. Contemporarily, the controller may either maintain a second intensity, $I_2$, or decrease the second intensity, $I_2$, of the second array of the plurality of second LEDs of the second LED filament. Optionally, following this first step of the operation, the controller is configured to decrease the first intensity, $I_1$, of the first array of the plurality of first LEDs of the first LED filament, and either maintain the second intensity, $I_2$, or increase the second intensity, $I_2$, of the second array of the plurality of second LEDs of the second LED filament.

Figure 5:
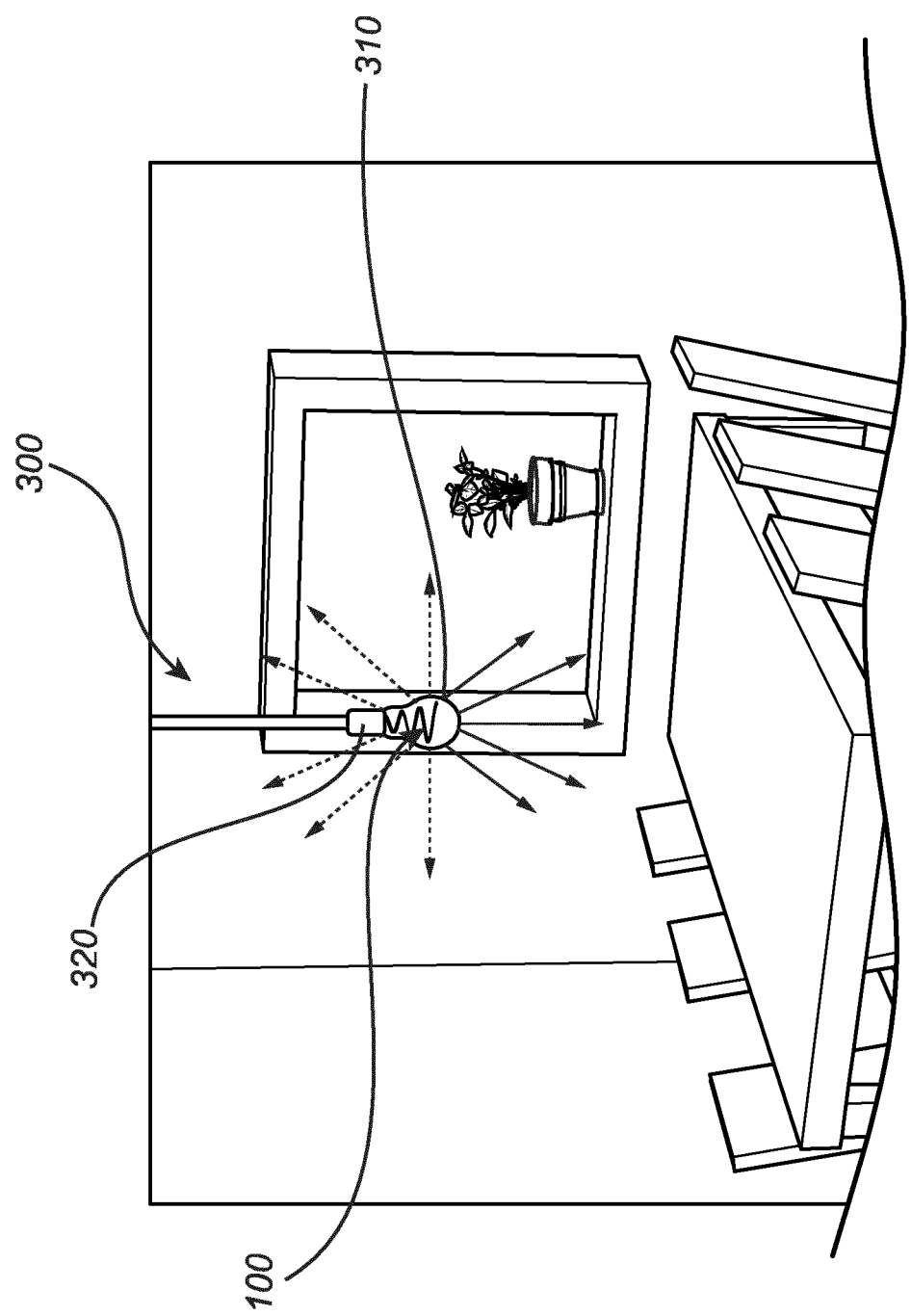
FIG. 5 shows LED lighting devices comprising a LED filament arrangement according to an exemplifying embodiment of the present invention.

FIG. 5 schematically shows a lighting device 300 according to an embodiment of the present invention in an indoor setting. The lighting device 300, which may constitute a lamp or a luminaire, comprises a LED filament arrangement 100 according to any one of the previously described embodiments. The lighting device 300 further comprises a cover 310, which is exemplified as being bulb-shaped. The cover 310 may comprise an at least partially light transmissive (e.g. transparent) material and at least partially encloses the LED filament arrangement 100. The lighting device 300 further comprises an electrical connection 320 connected to the LED filament arrangement 100 for a supply of power to the plurality of LEDs of the LED filament arrangement 100.

The person skilled in the art realizes that the present invention by no means is limited to the preferred embodiments described above. On the contrary, many modifications and variations are possible within the scope of the appended claims. For example, one or more of the first and/or second LED filaments 110a, 110b, the encapsulant 150, the reflector(s) 160, etc., may have different shapes, dimensions and/or sizes than those depicted/described.

The invention claimed is:

1. A light emitting diode, LED, filament arrangement arranged to emit LED filament arrangement light, comprising at least a first LED filament arranged to emit first LED filament light, wherein the at least a first LED filament elongates along a first axis, A, and comprises a first array of a plurality of first LEDs arranged to emit first LED light, at least a second LED filament arranged to emit second LED filament light, wherein the at least a second LED filament elongates along the first axis, A, and comprises a second array of a plurality of second LEDs arranged to emit second LED light, a carrier elongating along the first axis, A, wherein the carrier is arranged to support the at least a first LED filament and the at least a second LED filament, at least one structure arranged to at least partially redirect the first LED filament light and the second LED filament light, wherein the at least one structure elongates along the first axis, A, is arranged adjacent at least one of the at least a first LED filament and the at least a second LED filament, and extends along a second axis, B, parallel to a normal of the carrier, and a controller configured to individually control the operation of the first array of the plurality of first LEDs and the second array of the plurality of second LEDs, wherein the at least one structure has a first height, $H_1$, along the second axis, B, and wherein at least one of the first array of the plurality of first LEDs and the second array of the plurality of second LEDs has a second height, $H_2$, along the second axis, B, wherein $H_1 > 1.5 \cdot H_2$, and wherein the at least one structure has a first width, $W_1$, along a third axis, C, perpendicular to the first axis, A, and the second axis, B, wherein $H_1 > 1.5 \cdot W_1$, and wherein the at least one structure is at least one of reflective and refractive, and wherein the at least one structure is arranged to, at least one of, at least partially reflect at least one of the first LED filament light and the second LED filament light, and at least partially refract at least one of the first LED filament light and the second LED filament light.

2. The LED filament arrangement according to claim 1, wherein the carrier and the at least one structure are unitary.

3. The LED filament arrangement according to claim 1, wherein the at least one structure is flexible.

4. The LED filament arrangement according to claim 1, wherein the at least one structure comprises at least one of silicone and polyurethane.

5. The LED filament arrangement according to claim 1, wherein the at least one structure comprises reflective particles in a polymer matrix.

6. The LED filament arrangement according to claim 1, wherein the at least one structure has a reflectivity of at least 80%.

7. The LED filament arrangement according to claim 1, further comprising an encapsulant enclosing the at least a first LED filament and the at least a second LED filament, wherein the encapsulant comprises a light-transmissive material.

8. The LED filament arrangement according to claim 1, wherein at least one of the at least a first LED filament comprises at least a first sub-encapsulant at least partially enclosing the first array of the plurality of first LEDs, wherein the at least a first sub-encapsulant comprises a first luminescent material for at least partly converting the first LED light into first converted LED light, and the at least a second LED filament comprises at least a second sub-encapsulant at least partially enclosing the second array of the plurality of second LEDs, wherein the at least a second sub-encapsulant comprises a second luminescent material for at least partly converting the second LED light into second converted LED light.

9. The LED filament arrangement according to claim 1, wherein the at least a first LED filament is arranged to emit first LED filament light with a first color temperature, $CT_1$, and the at least a second LED filament is arranged to emit second LED filament light with a second color temperature, $CT_2$, wherein one of $CT_1=CT_2$ and $CT_1>CT_2$ is fulfilled.

10. The LED filament arrangement according to claim 1, wherein the at least a first LED filament and the at least a second LED filament elongate in, at least one of, a meandering shape in a plane, P, a spiral shape, and a helix shape.

11. The LED filament arrangement according to claim 1, wherein the controller is configured to individually control the operation of the first array of the plurality of first LEDs and the second array of the plurality of second LEDs by at least one of increasing a first intensity, $I_1$, of the first array of the plurality of first LEDs, and one of maintaining a second intensity, $I_2$, and decreasing a second intensity, $I_2$, of the second array of the plurality of second LEDs, and decreasing a first intensity, $I_1$, of the first array of the plurality of first LEDs, and one of maintaining a second intensity, $I_2$, and increasing a second intensity, $I_2$, of the second array of the plurality of second LEDs.

12. A lighting device, comprising a LED filament arrangement according to claim 1, a cover comprising an at least partially light-transmissive material, wherein the cover at least partially encloses the LED filament arrangement, and an electrical connection connected to the LED filament arrangement for a supply of power to the plurality of LEDs of the LED filament arrangement.

* * * * *